(12) United States Patent
Sekiya et al.

(10) Patent No.: US 12,330,266 B2
(45) Date of Patent: Jun. 17, 2025

(54) POLISHING APPARATUS WITH THICKNESS MEASURING UNIT

(71) Applicant: DISCO CORPORATION, Tokyo (JP)

(72) Inventors: Kazuma Sekiya, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 336 days.

(21) Appl. No.: 18/055,941

(22) Filed: Nov. 16, 2022

(65) Prior Publication Data

US 2023/0150086 A1    May 18, 2023

(30) Foreign Application Priority Data

Nov. 17, 2021  (JP) .................................. 2021-187197

(51) Int. Cl.

| B24B 49/12 | (2006.01) |
|---|---|
| B24B 37/013 | (2012.01) |
| B24B 37/04 | (2012.01) |
| B24B 37/20 | (2012.01) |
| H01L 21/67 | (2006.01) |

(52) U.S. Cl.
CPC ............ *B24B 49/12* (2013.01); *B24B 37/013* (2013.01); *B24B 37/042* (2013.01); *B24B 37/20* (2013.01); *H01L 21/67253* (2013.01)

(58) Field of Classification Search
CPC ....... B24B 37/13; B24B 37/042; B24B 37/20; B24B 37/10; B24B 37/00; B24B 49/02; B24B 49/12; H01L 21/67253
See application file for complete search history.

(56) References Cited

U.S. PATENT DOCUMENTS

| 7,499,185 B2 | 3/2009 | Nomaru et al. |
| 11,168,977 B2 | 11/2021 | Kimura et al. |
| 2019/0044494 A1* | 2/2019 | Abatake ............... H10N 30/085 |

(Continued)

FOREIGN PATENT DOCUMENTS

| JP | 08099265 A | 4/1996 |
| JP | 2008209299 A | 9/2008 |
| JP | 2010167521 A | 8/2010 |

(Continued)

OTHER PUBLICATIONS

Japanese Patent Application 2021-187197: English translation of Office Action, Apr. 22, 2025 (3 pages).

*Primary Examiner* — C. A. Rivera
(74) *Attorney, Agent, or Firm* — Greer, Burns & Crain, Ltd

(57) ABSTRACT

A polishing apparatus includes a polishing unit that rotatably supports a polishing pad for polishing a wafer held on a holding surface of a chuck table and that has a spindle formed with a through-hole extending from one end of the spindle to the other end of the spindle in an axis of the spindle. A thickness measuring unit is disposed at one end of the through-hole of the spindle that measures a thickness of the wafer. A controller obtains information regarding the thickness of the wafer measured by the thickness measuring unit at a position defined by a variation in a distance between a rotational center of the rotating wafer fed by a parallel feeding mechanism, a center of the other end of the through-hole facing the wafer, and a rotational angle of the chuck table, and forms mapping data regarding the thickness of the wafer.

15 Claims, 3 Drawing Sheets

(56) References Cited

U.S. PATENT DOCUMENTS

2020/0096318 A1 3/2020 Kimura et al.
2020/0340801 A1 10/2020 Kimura et al.

FOREIGN PATENT DOCUMENTS

| JP | 2015134383 A | | 7/2015 |
|----|--------------|---|--------|
| JP | 2015157331 A | * | 9/2015 |
| JP | 2020046410 A | | 3/2020 |
| JP | 2020176999 A | | 10/2020 |

* cited by examiner

POLISHING APPARATUS WITH THICKNESS MEASURING UNIT

BACKGROUND OF THE INVENTION

Field of the Invention

The present invention relates to a polishing apparatus for polishing a wafer held on a holding surface of a chuck table.

Description of the Related Art

A wafer having a plurality of devices such as integrated circuits (ICs) and large-scale integration circuits (LSIs) formed on a front surface thereof in a state of being partitioned by a plurality of intersecting streets is thinned by grinding of a back side thereof by a grinding apparatus, is then subjected to polishing by a polishing apparatus for removing grinding marks, is thereafter divided into individual device chips by a dicing apparatus or a laser processing apparatus, and the device chips thus divided are utilized for electric equipment such as a mobile phone and a personal computer.

The polishing apparatus for polishing the back surface of the wafer generally includes a chuck table that holds the wafer, and a polishing unit that has, in a rotatable manner, a polishing pad for polishing the wafer held by the chuck table, and is capable of polishing the ground surface of the wafer to process the surface into a desired smooth state (see, for example, Japanese Patent Laid-Open No. Hei 08-099265).

SUMMARY OF THE INVENTION

Incidentally, when the grinding marks generated by processing by the grinding apparatus are removed by the polishing apparatus and a laser beam is then applied to the wafer in order to divide the wafer into individual device chips, inappropriate processing by the laser beam may cause insufficient division of the wafer, resulting in possible damage to the device chips.

As a result of the present inventors' extensive and intensive study of the cause of the above problem, it becomes clear that, since the wafer becomes ununiform in thickness after the grinding marks are removed by the polishing apparatus, and at a time of applying the laser beam to the wafer to divide the wafer into the individual device chips, the focal point of the laser beam would not be positioned at a suitable position, so that processing by the laser beam may not be carried out suitably.

Accordingly, it is an object of the present invention to provide a polishing apparatus which is capable of solving the problem that insufficient division of the wafer attributable to inappropriate processing by a laser beam leads to damages to device chips.

In accordance with an aspect of the present invention, there is provided a polishing apparatus including a chuck table that has a holding surface and is rotatable, a polishing unit that rotatably supports a polishing pad for polishing a wafer held on the holding surface of the chuck table and that has a spindle formed with a through-hole extending from one end of the spindle to the other end of the spindle in an axis of the spindle, a vertical feeding mechanism that relatively puts the polishing unit into processing feeding in a vertical direction to the holding surface of the chuck table, a parallel feeding mechanism that relatively puts the polishing unit into processing feeding in a direction parallel to the holding surface of the chuck table, a thickness measuring unit that is disposed at one end of the through-hole of the spindle and that measures a thickness of the wafer, and a controller. The controller obtains information regarding the thickness of the wafer measured by the thickness measuring unit at a position defined by a variation in a distance between a rotational center of the rotating wafer held on the chuck table fed by the parallel feeding mechanism and a center of the other end of the through-hole facing the wafer and a rotational angle of the chuck table, and forms mapping data regarding the thickness of the wafer.

Preferably, the thickness measuring unit includes a light source that emits light in such a wavelength region as to be transmitted through the wafer, a condenser that applies the light emitted by the light source to the wafer held on the chuck table, a light branching section that is disposed in an optical path connecting the light source and the condenser and that branches return light reflected from the wafer held on the chuck table from the optical path, a diffraction grating that spectrally disperses the return light branched by the light branching section by wavelength, and an image sensor that detects intensity of the light spectrally dispersed by wavelength by the diffraction grating and that generates a spectral interference waveform.

Preferably, the controller includes a thickness calculation section that calculates the spectral interference waveform generated by the image sensor and that outputs thickness information and a determination section that determines, based on the mapping data, that the the thickness of the wafer is passed in a case where variation of the thickness of the wafer is less than an allowable value and that the thickness of the wafer is failed in a case where the variation of the thickness of the wafer is the allowable value or more.

According to the present invention, the thickness of the wafer is measured by the thickness measuring unit, and mapping data regarding the thickness of the wafer is formed. Hence, variation of the thickness of the wafer after polishing is carried out can be grasped, so that it is possible to permit the conveyance to the subsequent step in which laser processing is carried out if the variation of the thickness of the wafer is less than an allowable value, and to instruct reprocessing if the variation of the thickness of the wafer is the allowable value or more. Therefore, it is possible to prevent dividing processing of the wafer with an ununiform thickness from being carried out, and only a wafer with a uniform thickness capable of being divided suitably is subjected to dividing processing. As a result, the wafer can reliably be divided into individual device chips, and the problem that the device chips may be damaged due to the presence of a region in which the division is insufficient is eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
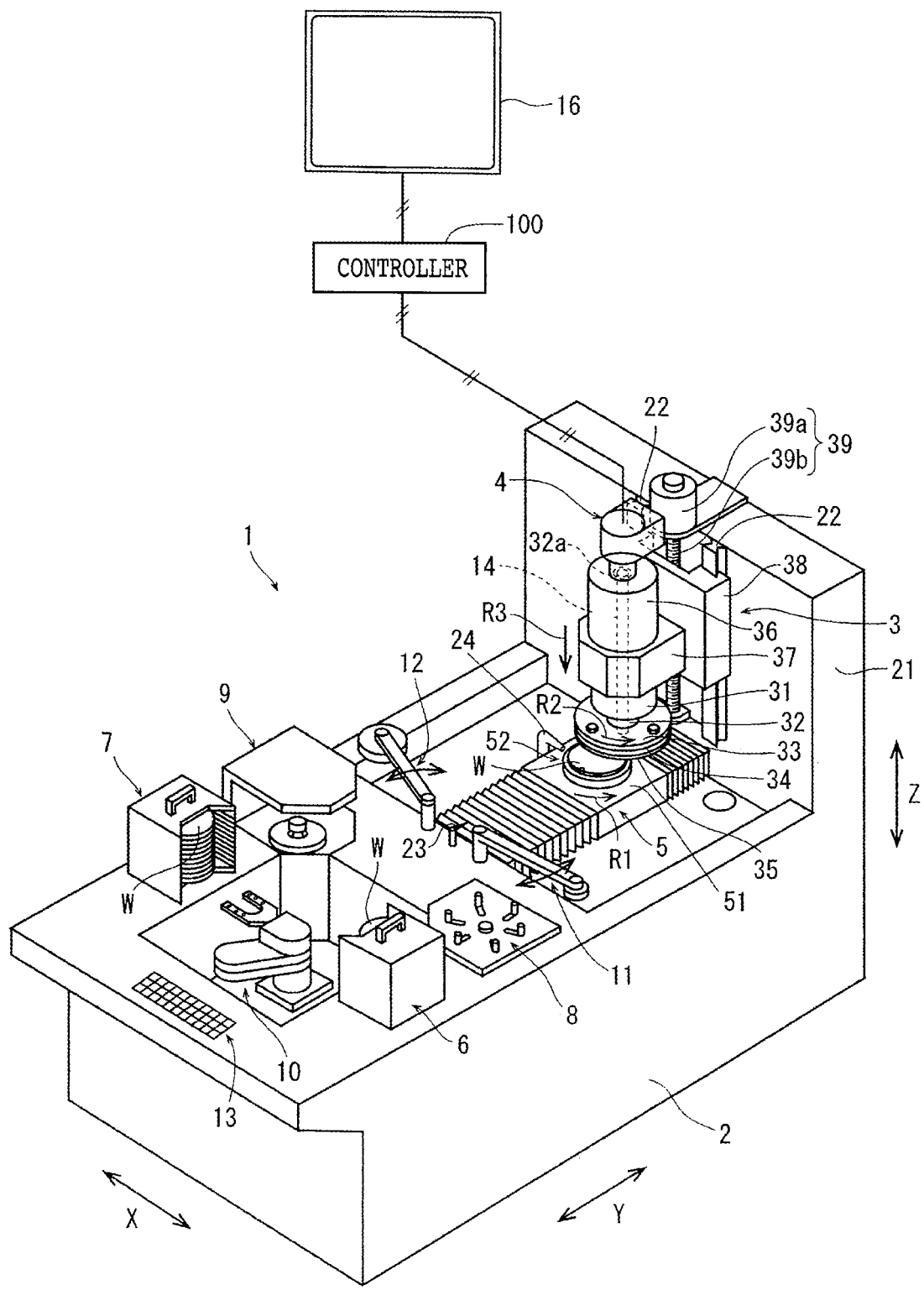
FIG. 1 is an overall perspective view of a polishing apparatus according to a preferred embodiment of the present invention.

A polishing apparatus according to a preferred embodiment of the present invention will be described in detail below with reference to the attached drawings. FIG. 1 depicts a perspective view of a polishing apparatus 1 of the present embodiment. The polishing apparatus 1 includes a substantially rectangular parallelepiped apparatus housing 2. The apparatus housing 2 includes: a polishing unit 3 that polishes a wafer W as a workpiece; a thickness measuring unit 4 that measures a thickness of the wafer W; a holding unit 5 that holds the wafer W; a first cassette 6 that is disposed on the front side in the figure that accommodates the wafer W before polishing; a second cassette 7 that is disposed on the other side in an X-axis direction in the figure relative to the first cassette 6 and that accommodates the wafer W after polishing; a temporary placing unit 8 that is disposed adjacent to the first cassette 6 in an Y-axis direction in the figure and centering the wafer W; a cleaning unit 9 that is disposed adjacent to the second cassette 7 in the Y-axis direction; a first conveying mechanism 10 that unloads the wafer W accommodated in the first cassette 6 to the temporary placing unit 8 and that conveys the wafer W cleaned by the cleaning unit 9 to the second cassette 7; a second conveying mechanism 11 that conveys the wafer W having been placed on the temporary placing unit 8 and centered, to a chuck table 52 of the holding unit 5 positioned at a loading/unloading position (on the front side in the figure); a third conveying mechanism 12 that conveys the wafer W after polishing from the chuck table 52 positioned at the loading/unloading position to the cleaning unit 9; and a controller 100. Note that the wafer W accommodated in the first cassette 6 is formed with a grinding mark due to back side grinding in the grinding carried out before conveying into the polishing apparatus 1, and the polishing apparatus 1 of the present embodiment removes the grinding mark by polishing.

The polishing unit 3 is mounted to a pair of guide rails 22 and 22 extending vertically on an inside surface of a support wall 21 erected on a rear end side of the apparatus housing 2 in a vertically movable manner. The polishing unit 3 includes: a unit housing 31; a wheel mount 33 disposed at a lower end of a spindle 32 rotatably supported by the unit housing 31; a polishing wheel 34 which is mounted to the wheel mount 33 and has a polishing pad 35 attached to a lower surface thereof; an electric motor 36 which is mounted to an upper end of the unit housing 31 and which rotates the wheel mount 33; and a moving base 38 that supports the unit housing 31 through a support member 37. The moving base 38 is provided with guided grooves slidably fitted to the guide rails 22 and 22, and the polishing unit 3 is supported in a vertically movable manner. In addition, the spindle 32 is formed in an axis thereof with a through-hole 14 (indicated by a broken line) extending to penetrate the spindle 32 from one end (upper end) of the spindle 32 to the other end (lower end) of the spindle 32, and an opening (omitted in illustration) at a position corresponding to a lower end of the through-hole 14 is formed on a lower surface side of the polishing pad 35 disposed on the polishing wheel 34.

The polishing apparatus 1 illustrated in the figure includes a vertical feeding mechanism 39 that lifts up and down the moving base 38 of the polishing unit 3 along the guide rails 22 and 22. The vertical feeding mechanism 39 includes a pulse motor 39a, a male screw rod 39b disposed vertically in parallel to the guide rails 22 and 22, supported by the support wall 21 in a rotatable manner, and driven to rotate by the pulse motor 39a, and a female screw block (not illustrated) mounted to the moving base 38 and screw engaged with the male screw rod 39b, the male screw rod 39b being driven for forward rotation and reverse rotation by the pulse motor 39a, whereby the polishing unit 3 is moved in a Z-axis direction (vertical direction). Further, on the front side of the apparatus housing 2 on which the first conveying mechanism 10 is disposed, an operation panel 13 for instructing polishing to the controller 100 and designating polishing conditions is disposed, and a display unit 16 for displaying processing information and the like is connected to the controller 100.

The holding unit 5 includes a cover table 51, and a chuck table 52 disposed at a center of the cover table 51 in an upwardly projecting manner. The chuck table 52 includes a holding surface on which the wafer W is held, and the holding surface is configured by a gas-permeable member. The chuck table 52 is rotatably supported, and is rotated by a rotational drive source not illustrated. In addition, a parallel feeding mechanism (omitted in illustration) that puts the chuck table 52 into processing feeding in a Y-axis direction indicated by an arrow Y and in parallel to a horizontal surface is disposed inside the apparatus housing 2, and moves the chuck table 52 between a loading/unloading position on the front side in the Y-axis direction and a polishing position directly below the polishing unit 3.

On the front side of the loading/unloading position of the chuck table 52, a cleaning water supply nozzle 23 for supplying cleaning water to the back surface of the wafer W after polishing is disposed. In addition, a slurry supply nozzle 24 is disposed in the vicinity of the polishing position, and, at a time of polishing, a liquid slurry containing free abrasive grains is jetted from the slurry supply nozzle 24, to supply the slurry onto the wafer W which is to be polished by the polishing pad 35. Note that the material of the polishing pad 35 is not particularly limited, and a material well-compatible with the slurry and elastically deformable, for example, a sheet of foamed polyurethane or felt (nonwoven fabric) can be used to form the polishing pad.

The thickness measuring unit 4 is disposed so as to face the opening 32a on one end side of the through-hole 14 formed in the spindle 32. The thickness measuring unit 4 is connected to the controller 100, measures the thickness of the wafer W at a predetermined position of the wafer W, and forms mapping data regarding the thickness of the wafer W described later.

Figure 2:
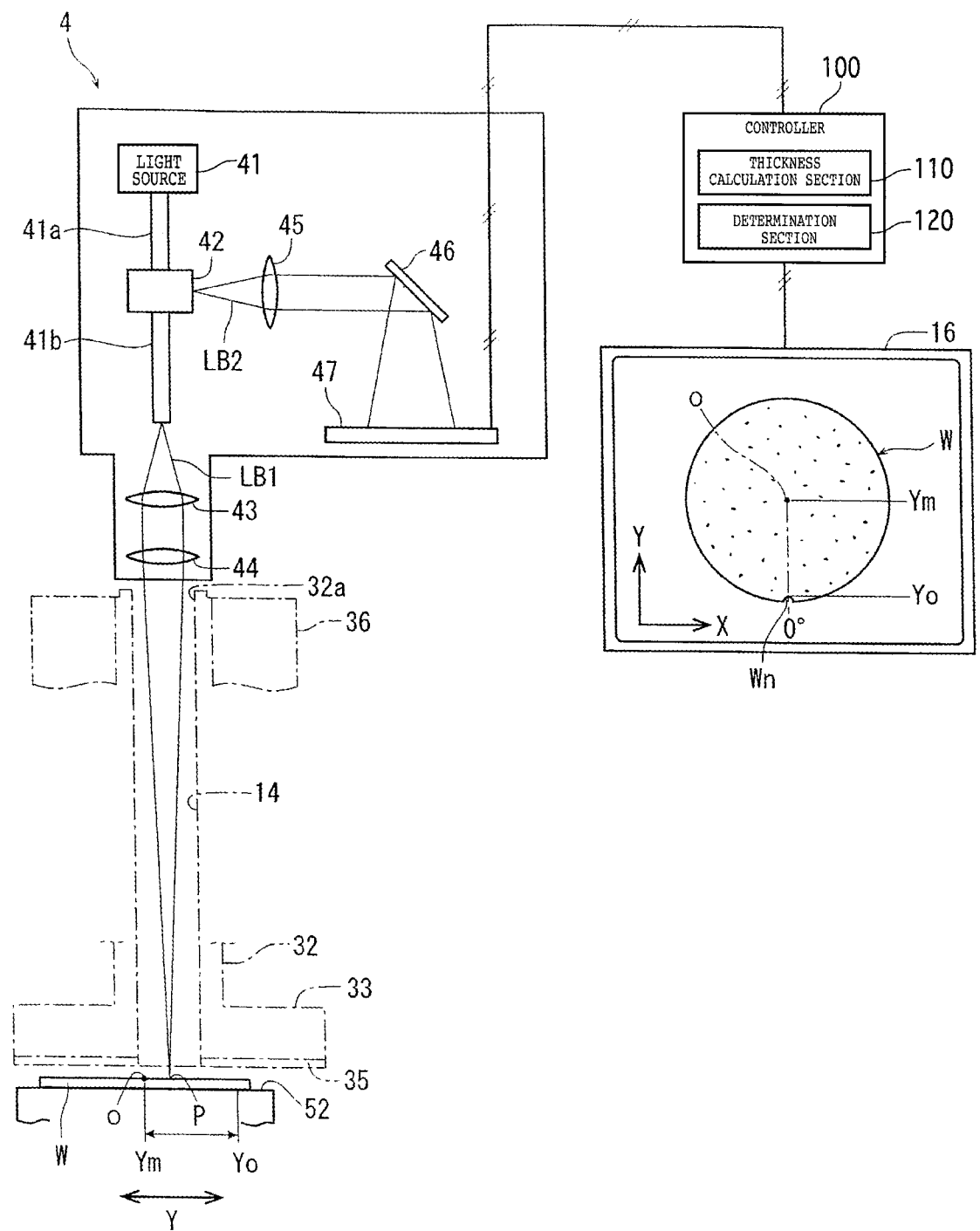
FIG. 2 is a block diagram depicting an optical system of a thickness measuring unit of the polishing apparatus depicted in FIG. 1.

FIG. 2 depicts a block diagram of an optical system constituting the thickness measuring unit 4, and the thickness measuring unit 4 will be described more specifically with reference to FIG. 2.

As depicted in FIG. 2, the optical system constituting the thickness measuring unit 4 includes: a light source 41 that emits light LB1 of such a predetermined wavelength region as to be transmitted through the wafer W held on the chuck table 52; a first optical path 41a formed of an optical fiber; a light branching section 42 that guides the light LB1 from the light source 41 into a second optical path formed of an optical fiber on the chuck table 52 side and that branches a return light LB2 obtained when the light LB1 emitted from the light source 41 is reflected by the wafer W held on the chuck table 52 and goes reversely into an optical path on the side of a collimation lens 45 depicted in the figure; a collimation lens 43 to which the light LB1 guided into the second optical path 41*b* is applied; a condenser lens 44 that concentrates the light LB1 applied from the collimation lens 43; a diffraction grating 46 that spectrally disperses the return light LB2 branched from the light branching section 42 and made to be parallel light by the collimation lens 45, by wavelength; and an image sensor 47 that receives the return light LB2 spectrally dispersed by the diffraction grating 46, detects light intensity by wavelength, and forms spectral interference waveforms. The spectral interference waveforms formed by the image sensor 47 are sent to the controller 100.

As the light source 41, for example, a halogen lamp that emits light having a wavelength of 400 to 1,200 nm can be adopted. The light branching section 42 can be selected, for example, from a polarization holding fiber coupler, a polarization holding fiber circulator, a single mode fiber coupler, a single mode fiber coupler circulator, and the like. In addition, the light source 41 is not limited to the abovementioned halogen lamp, but is selected according to the material of the wafer W to be polished, and is appropriately selected from a known light source that emits light of such a wavelength as to be transmitted through the wafer W. Besides, the light LB1 guided by the condenser lens 44 is concentrated by the condenser lens 44 and is guided to the through-hole 14 inside the spindle 32, and a focal point P is positioned at a position corresponding to a center of the other end (lower end) of the through-hole 14, on the front surface of the wafer W held on the chuck table 52.

The controller 100 includes a computer which includes a central processing unit (CPU) that performs arithmetic processing according to a control program, a read only memory (ROM) that stores the control program and the like, a readable and writable random access memory (RAM) that temporarily stores detected values, results of the arithmetic processing, and the like, an input interface, and an output interface (illustration of the details is omitted). The controller 100 is equipped with a thickness calculation section 110 and a determination section 120. The thickness calculation section 110 performs Fourier transformation on the spectral interference waveforms generated by the image sensor 47 that receives the return light LB2, obtained when the light LB1 emitted from the light source 41 is reflected by the front surface and the back surface of the wafer W held on the chuck table 52 and the reflected light as the return light LB2 is guided through the condenser lens 44, the collimation lens 43, the light branching section 42, and the diffraction grating 46, and outputs thickness information of the wafer W. The determination section 120 determines whether or not variation of the thickness of the wafer W is within an allowable range, based on mapping data (described in detail later) formed by the thickness calculation section 110.

The polishing apparatus 1 of the present embodiment has generally the above-described configuration, and the functions and actions of the polishing apparatus 1 will be described more specifically below.

In carrying out polishing of the wafer W by use of the polishing apparatus 1 of the present embodiment, the first conveying mechanism 10 and the second conveying mechanism 11 are operated to convey the wafer W accommodated in the first cassette 6 through the temporary placing unit 8 to the chuck table 52, and the wafer W is placed on the chuck table 52 with the front surface side thereof directed downward and the back surface side thereof directed upward. When the wafer W is placed on the chuck table 52, suction means omitted in illustration is operated to generate a suction negative pressure on the holding surface of the chuck table 52, to thereby suction hold the wafer W. An appropriate protective film may be attached to the front surface side of the wafer W.

When the abovementioned wafer holding step is carried out, the chuck table 52 is moved to the polishing position directly under the polishing unit 3 by the abovementioned parallel feeding mechanism, and polishing is conducted in which the wafer W is polished while supplying the slurry from the slurry supply nozzle 24 to the back surface of the wafer W. More specifically, first, the chuck table 52 is rotated in a direction indicated by an arrow R1 in FIG. 1 by rotation drive means not illustrated, the abovementioned electric motor 36 is operated to rotate the spindle 32 of the polishing unit 3 in a direction indicated by an arrow R2, and the abovementioned vertical feeding mechanism 39 is operated to lower the polishing unit 3 in a direction indicated by an arrow R3. The polishing pad 35 is put into contact with the back surface of the wafer W, and is pressed against the wafer W with a predetermined pressing load while supplying the slurry from the slurry supply nozzle 24, thereby carrying out polishing for a predetermined time, to remove the grinding mark due to the grinding previously carried out from the back surface of the wafer W and smoothen the back surface of the wafer W.

When the polishing is conducted, the chuck table 52 is moved to the loading/unloading position on the front side of FIG. 1 by the abovementioned parallel feeding mechanism, and cleaning water is jetted from the cleaning water supply nozzle 23 to the back surface of the rotating wafer W, to clean the back surface of the wafer W.

When the wafer W has been cleaned by the cleaning water supply nozzle 23, the chuck table 52 is again moved toward the polishing position directly under the polishing unit 3. Incidentally, the thickness calculation section 110 has a table 112 (see FIG. 3) stored therein, and in the table 112, a plurality of predetermined positions are defined by a variation in a distance (Y0–Ym) between a rotational center O of the rotating wafer W held on the chuck table 52 fed by the abovementioned parallel feeding mechanism and a center of the other end of the through-hole 14 facing the wafer W and by a variation in the rotational angle (0° to 360°) of the chuck table 52 with a direction connecting the rotational center O and a notch Wn being set as a reference (0°), based on the shape data of the wafer W displayed on the display unit 16. Then, the chuck table 52 is put to parallel movement in the Y-axis direction by the parallel feeding mechanism, and at predetermined positions defined by variations of the rotational center O of the wafer W rotating at an appropriate speed and a position corresponding to the center on the side of the other end (lower end) of the through-hole 14 of the spindle 32 facing the wafer W and by a variation in the rotational angle of the chuck table, the thickness of the wafer W is calculated. Then, thickness information corresponding to all the predetermined positions defined in the table 112 depicted in FIG. 3 is calculated and stored, to complete the mapping data.

In the present embodiment, in the direction in which the notch Wn of the wafer W displayed on the display unit 16 of FIG. 2, measurement of the thickness of the wafer W is started from the inside (the position indicted by Y0 in the figure) of an outer edge region where the notch Wn is formed. When the thickness of the wafer W has been measured at the measurement start point (angle 0°, Y0), while rotating the wafer W, the thickness of the wafer W is calculated, for example, by intervals of 36° by the thickness calculation section 110, and, by rotating through 360°, thickness information at each point (92, 92, 93, 93, 92, . . . 92 μm) is stored at a predetermined position in the table 112 depicted in FIG. 3. Note that the thickness at 0° and the thickness at 360° are obtained by measuring the thickness of the wafer W at the same position, and therefore, measuring of the thickness at 360° may be omitted. Next, the chuck table 52 is put to parallel movement by the abovementioned parallel feeding mechanism, thereby to bring the position to be applied by the light LB1 by the thickness measuring unit 4 closer toward the rotational center O, by a distance obtained by dividing the distance from the abovementioned measurement start point to the rotational center O by a predetermined interval, and 360° rotation is made while measuring the thickness of the wafer W by intervals of 36° as described above, thereby to measure the thickness of the wafer W.

Figure 3:
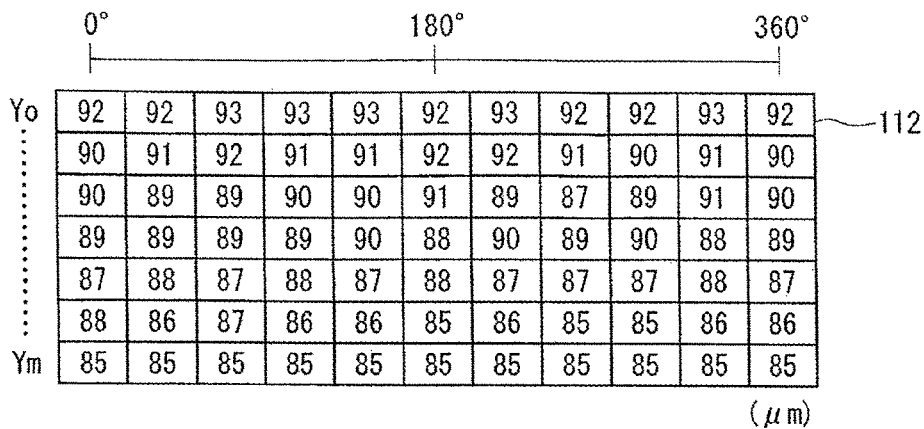
FIG. 3 is a conceptual diagram of mapping data stored in a table.

By repeating this, thickness information regarding the whole region of the wafer W is recorded in the table 112 depicted in FIG. 3, thereby to complete the mapping data. Note that the position defined by Ym in the present embodiment is a position coinciding with the rotational center O of the wafer W, and the position to be applied by the light LB1 by the thickness measuring unit 4 coincides with the rotational center O of the wafer W, so that the thickness of the wafer W does not vary even when the thickness of the wafer W is measured a plurality of times during 360° rotation. By these operations, the controller 100 acquires information regarding the thickness of the wafer W at all the positions defined in the table 112 by the thickness measuring unit 4, resulting in mapping data as depicted in FIG. 3. Note that, in the above-described embodiment, the parallel feeding mechanism has been operated stepwise by intervals of 360° rotation of the wafer W to bring the position to be applied by the light LB1 closer toward the rotational center O, but the present invention is not limited to this; the thickness information may be calculated, what is generally called in a spiral manner, by measuring the thickness of the wafer W, bringing the position to be applied by the light LB1 closer toward the rotational center O bit by bit by intervals of 36° rotation.

Figure 4:
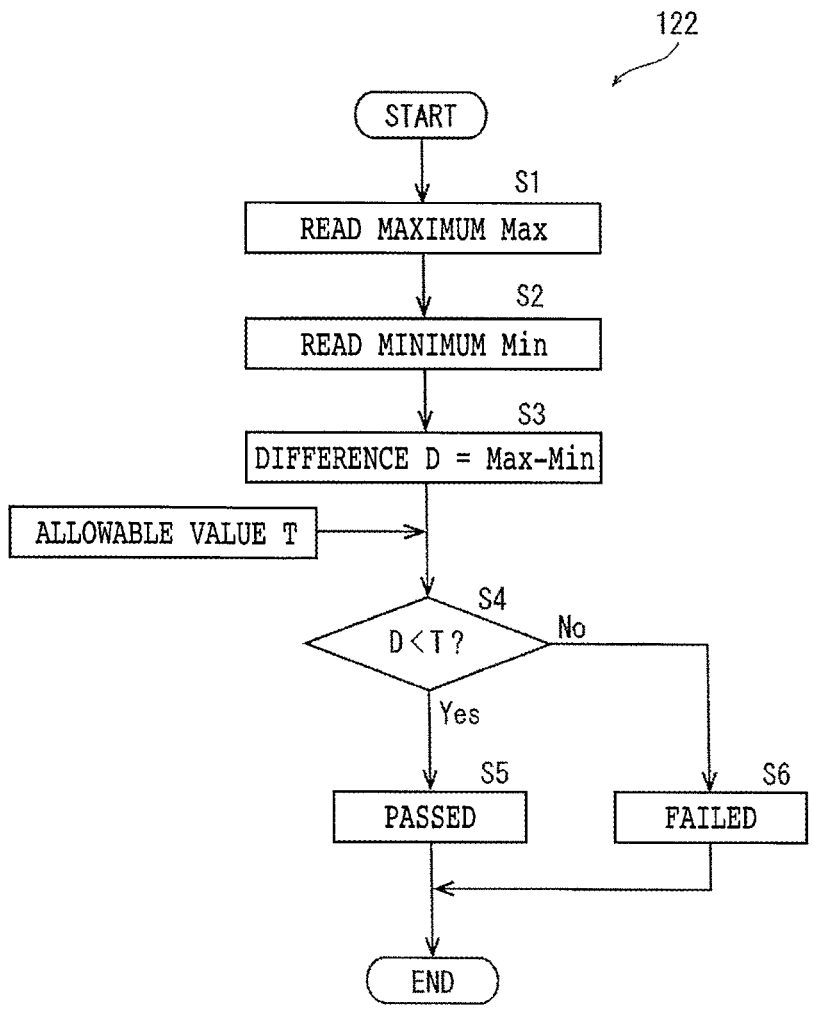
FIG. 4 is a flow chart to be carried out by a determination section.

The determination section 120 of the controller 100 of the present embodiment determines, based on the mapping data stored in the table 112, that the thickness of the wafer W is acceptable (passed) when the variation of the thickness of the wafer W is less than an allowable value, and that the thickness of the wafer W is inacceptable (failed) when the variation of the thickness of the wafer W is the allowable value or more. FIG. 4 depicts a flow chart 122 which the determination section 120 carries out.

In carrying out the flow chart 122, first, in step S1, all the data of the mapping data described above is referred to, and a maximum Max of the thickness information of the wafer W is read. Note that the maximum Max of the thickness information of the wafer W in the mapping data stored in the table 112 in the present embodiment is 93 μm. Next, proceeding to step S2 is made, and a minimum Min of the thickness information of the wafer W in the mapping data is read. The minimum Min of the thickness information of the wafer W in the mapping data in the present embodiment is 85 μm. Next, proceeding to step S3 is made, and the difference D=Max −Min is calculated (in the present embodiment, D=8 μm). Here, the controller 100 stores the allowable value T of the variation of the thickness of the wafer W, the determination section 120 reads the allowable value T (in the present embodiment, 5 μm) and in step S4, determines whether or not the difference D is less than the allowable value T. In the present embodiment, since it is determined that the difference D (8 μm) is more than the allowable value T (5 μm) (No), the determination result in step S6 is "failed." Note that, if the difference D is less than the allowable value T (5 μm), the determination result in step S5 is "passed," and the flow chart 122 comes to an end (END). The determination results of steps S5 and S6 are appropriately displayed on the display unit 16, and are stored in the controller 100.

According to the above-described embodiment, by forming the mapping data, the variation of the thickness of the wafer W can be grasped, and the polishing carried out in the polishing apparatus 1 can be evaluated. In addition, if the variation of the thickness of the wafer W is less than the allowable value, conveyance of the wafer W to the subsequent step in which laser processing is to be carried out is permitted, whereas, if the variation of the thickness of the wafer W is the allowable value or more, reprocessing is instructed, and if reprocessing is not possible, discarding of the wafer W or the like is instructed. As a result, carrying out dividing processing of a wafer with a nonuniform thickness can be prevented, and only a wafer having a uniform thickness which can be divided suitably is subjected to dividing processing. As a result, the wafer can be divided into individual device chips reliably, and the problem that device chips may be damaged due to the presence of a region in which the division is insufficient is eliminated.

Note that the present invention is not limited to the above-described embodiment. For example, in the above-described embodiment, in measuring the thickness at a predetermined position of the wafer W, the thickness calculation section 110 performs waveform analysis such as Fourier transformation on the spectral interference waveform generated by the image sensor 47 to thereby output thickness information, but the present invention is not limited to this. For example, a thickness measuring unit can be provided in which the spectral interference waveform acquired based on the return light of light applied through the through-hole 14 and a reference waveform preliminarily recorded in a reference waveform recording section are checked with each other, to determine the thickness from the reference waveform that has been coincident with the spectral interference waveform (see, for example, Japanese Patent Laid-Open No. 2020-176999). Further, a white light source, a first pinhole mask through which light of a part of a waveform of diffracted light obtained by spectrally dispersing white light by acoustooptic deflecting means is allowed to pass, a chromatic aberration lens that concentrates the light having passed through the first pinhole mask to apply the concentrated light to a workpiece, a beam splitter which deflects the reflected light of the light applied to the workpiece, a second pinhole mask through which the reflected light deflected by the beam splitter is allowed to pass, a light receiving element that outputs a light reception signal of the reflected light having passed through the second pinhole mask, and a thickness measuring unit that determines a height position of the workpiece based on a control signal for the acoustooptic deflecting means and the light reception signal from the light receiving element (see, for example, Japanese Patent Laid-open No. 2008-209299) may be prepared, and they may be disposed on the other end side of the abovementioned spindle 32.

In addition, in the above-described embodiment, at a time of measuring the thickness of the wafer W by the thickness measuring unit 4, the rotational angle of the wafer W held on the chuck table 52 and rotated has been set at intervals of 36°, but the present invention is not limited to this; for example, the rotational angle may be set by intervals of another angle, for example, by intervals of 5°, 10°, or the like.

Further, in the above-described embodiment, measurement of the thickness of the wafer W has been carried out after polishing of the wafer W is finished, but the present invention is not limited to this. For example, the measurement of the thickness of the wafer W may be carried out during polishing of the wafer W by the abovementioned polishing apparatus. In that case, the slurry is not supplied from the abovementioned slurry supply nozzle 24, and the polishing pad may preliminarily be filled with abrasive, and dry polishing is preferably carried out.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A polishing apparatus comprising:
   a chuck table that has a holding surface and is rotatable and is moveable in a direction parallel to the holding surface;
   a polishing unit that rotatably supports a polishing pad for polishing a wafer comprising grinding marks held on the holding surface of the chuck table and that has a spindle formed with a through-hole extending from one end of the spindle to the other end of the spindle in an axis of the spindle;
   a vertical feeding mechanism that relatively puts the polishing unit into processing feeding in a vertical direction to the holding surface of the chuck table;
   a thickness measuring unit that is disposed at a first end of the through-hole of the spindle and that measures a thickness of the wafer during or after the wafer is polished by the polishing pad; and
   a controller,
   wherein the controller obtains information regarding the thickness of the wafer measured by the thickness measuring unit at a plurality of positions defined by a variation in a distance between a rotational center of the rotating wafer held on the chuck table and a center of a second end of the through-hole facing the wafer and by variation in a rotational angle of the chuck table, and forms mapping data regarding the thickness of the wafer.

2. The polishing apparatus according to claim 1,
   wherein the thickness measuring unit includes
   a light source that emits light in such a wavelength region as to be transmitted through the wafer,
   a condenser that applies the light emitted by the light source to the wafer held on the chuck table,
   a light branching section that is disposed in an optical path connecting the light source and the condenser and that branches return light reflected from the wafer held on the chuck table from the optical path,
   a diffraction grating that spectrally disperses the return light branched by the light branching section by wavelength, and
   an image sensor that detects intensity of the light spectrally dispersed by wavelength by the diffraction grating and that generates a spectral interference waveform,
   wherein the controller includes a thickness calculation section that calculates the spectral interference waveform generated by the image sensor and that outputs thickness information.

3. The polishing apparatus according to claim 2,
   wherein the controller includes a determination section that determines, based on the mapping data, that the thickness of the wafer is passed in a case where variation of the thickness of the wafer is less than an allowable value and that the thickness of the wafer is failed in a case where the variation of the thickness of the wafer is the allowable value or more.

4. The polishing apparatus according to claim 1,
   wherein the wafer has a front surface side and a back surface side, wherein the grinding marks are on the back surface side of the wafer;
   wherein the wafer is held on the chuck table with the front surface side directed downward and the back surface side directed upward.

5. The polishing apparatus according to claim 4,
   wherein a plurality of devices are formed on a front surface side of the wafer; and
   wherein a protective film is attached to the front surface side of the wafer.

6. A polishing apparatus comprising:
   a chuck table that has a holding surface and is rotatable and is moveable in a direction parallel to the holding surface;
   a polishing pad for polishing a wafer comprising grinding marks held on the holding surface of the chuck table;
   a spindle formed with a through-hole extending from a first end of the spindle to a second end of the spindle in an axis of the spindle, the through-hole having a corresponding first end and second end, wherein the spindle is rotatable about the axis of the spindle and is coupled to the polishing pad, the second end of the through-hole facing the wafer and aligned with a hole in the polishing pad;
   a vertical feeding mechanism that relatively puts the polishing pad into processing feeding in a vertical direction to the holding surface of the chuck table;
   an image sensor that is disposed to detect light from the first end of the through-hole of the spindle; and
   a controller communicatively coupled to the image sensor,
   wherein the controller obtains a signal from the image sensor and generates wafer thickness information during or after the wafer is polished by the polishing pad and forms mapping data regarding the thickness of the wafer,
   wherein the mapping data comprises the thickness of the wafer is measured at a plurality of positions defined by a variation in a distance between a rotational center of the rotating wafer held on the chuck table and a center of the second end of the through-hole facing the wafer and by a variation in a rotational angle of the chuck table.

7. The polishing apparatus according to claim 6,
   wherein the image sensor is part of a thickness measuring unit that further includes:
   a light source that emits light in such a wavelength region as to be transmitted through the wafer,
   a condenser that applies the light emitted by the light source to the wafer held on the chuck table,
   a light branching section that is disposed in an optical path connecting the light source and the condenser and that branches return light reflected from the wafer held on the chuck table from the optical path, and a diffraction grating that spectrally disperses the return light branched by the light branching section by wavelength, and wherein the image sensor detects intensity of the light spectrally dispersed by wavelength by the diffraction grating and that generates a spectral interference waveform, wherein the wafer thickness information generated by the controller is generated by using the spectral interference waveform generated by the image sensor.

8. The polishing apparatus according to claim 7, wherein the controller includes a determination section that determines, based on the mapping data, that the thickness of the wafer is passed in a case where variation of the thickness of the wafer is less than an allowable value and that the thickness of the wafer is failed in a case where the variation of the thickness of the wafer is the allowable value or more.

9. The polishing apparatus according to claim 6, wherein the wafer has a front surface side and a back surface side, wherein the grinding marks are on the back surface side of the wafer;

wherein the wafer is held on the chuck table with the front surface side directed downward and the back surface side directed upward.

10. The polishing apparatus according to claim 9, wherein a plurality of devices are formed on a front surface side of the wafer; and wherein a protective film is attached to the front surface side of the wafer.

11. A polishing method using a polishing apparatus comprising:

holding a wafer comprising grinding marks on a chuck table that has a holding surface;

rotating the wafer held on the chuck table;

polishing the rotating wafer held on the holding surface of the chuck table with a rotating polishing pad, wherein the polishing apparatus comprises a spindle formed with a through-hole extending from a first end of the spindle to a second end of the spindle in an axis of the spindle, the through-hole having a corresponding first end and second end, wherein the spindle is rotatable about the axis of the spindle and is coupled to the polishing pad, the second end of the through-hole facing the wafer and aligned with a hole in the polishing pad;

the polishing comprises putting the polishing pad into processing feeding in a vertical direction to the holding surface of the chuck table;

during or after polishing the wafer with the polishing pad:
detecting light from the wafer using an image sensor that is disposed to detect light from the first end of the through-hole of the spindle; and using a controller obtaining a signal from the image sensor and generating wafer thickness information during or after the wafer is polished by the polishing pad and forming mapping data regarding the thickness of the wafer, wherein the mapping data comprises the thickness of the wafer measured at a plurality of positions defined by a variation in a distance between a rotational center of the rotating wafer held on the chuck table and a center of the second end of the through-hole facing the wafer and by a variation in a rotational angle of the chuck table.

12. The polishing method according to claim 11, wherein the image sensor is part of a thickness measuring unit and the method further comprises:

emitting light from a light source in such a wavelength region as to be transmitted through the wafer, condensing the light emitted by the light source to the wafer held on the chuck table using a condenser, branching return light reflected from the wafer held on the chuck table from an optical path using a light branching section that is disposed in the optical path connecting the light source and the condenser, and spectrally dispersing the return light branched by the light branching section by wavelength using a diffraction grating, and wherein the image sensor detects intensity of the light spectrally dispersed by wavelength by the diffraction grating and generates a spectral interference waveform, wherein the wafer thickness information generated by the controller is generated by using the spectral interference waveform generated by the image sensor.

13. The polishing method according to claim 12, wherein the controller includes a determination section, the method further comprising:

the determination section determining, based on the mapping data, that the thickness of the wafer is passed in a case where variation of the thickness of the wafer is less than an allowable value and that the thickness of the wafer is failed in a case where the variation of the thickness of the wafer is the allowable value or more.

14. The polishing method according to claim 11, wherein the wafer has a front surface side and a back surface side, wherein the grinding marks are on the back surface side of the wafer;

wherein the wafer is held on the chuck table with the front surface side directed downward and the back surface side directed upward.

15. The polishing method according to claim 14, wherein a plurality of devices are formed on a front surface side of the wafer; and wherein a protective film is attached to the front surface side of the wafer.

* * * * *